(12) United States Patent
Van Eessen et al.

(10) Patent No.: US 11,631,703 B2
(45) Date of Patent: Apr. 18, 2023

(54) SYSTEM AND METHOD FOR DISPLAY PANEL

(71) Applicant: BARCO NV, Kortrijk (BE)

(72) Inventors: Wim Van Eessen, Kruishoutem (BE); Patrick Albin Willem, Ostend (BE); Bart Van Den Bossche, Marke (BE); Peter Leon Jean-Marie Gerets, Roeselare (BE)

(73) Assignee: BARCO NV, Kortrijk (BE)

( * ) Notice: Subject to any disclaimer, the term of this patent is extended or adjusted under 35 U.S.C. 154(b) by 28 days.

(21) Appl. No.: 16/904,649

(22) Filed: Jun. 18, 2020

(65) Prior Publication Data

US 2021/0399020 A1     Dec. 23, 2021

(51) Int. Cl.
*H01L 27/12* (2006.01)
*G06F 1/18* (2006.01)

(52) U.S. Cl.
CPC .......... *H01L 27/124* (2013.01); *G06F 1/182* (2013.01); *G06F 1/189* (2013.01); *H01L 27/1262* (2013.01)

(58) Field of Classification Search
CPC ............... H01L 27/156; H01L 25/167; H01L 23/49805; H01L 23/60; H01L 27/3251; H01L 27/3253; H01L 27/124; H01L 27/3276
See application file for complete search history.

(56) References Cited

U.S. PATENT DOCUMENTS

| | | | |
|---|---|---|---|
| 6,157,066 A * | 12/2000 | Kobayashi | H01L 23/62 257/E23.149 |
| 10,545,364 B2 | 1/2020 | Wu et al. | |
| 2005/0217720 A1 | 10/2005 | Rey-Mermet et al. | |
| 2008/0090338 A1* | 4/2008 | Tredwell | H01L 27/124 257/E29.295 |
| 2022/0052080 A1* | 2/2022 | Kim | H01L 27/12 |

FOREIGN PATENT DOCUMENTS

JP        H01191827 A     8/1989

* cited by examiner

*Primary Examiner* — Peter M Albrecht
(74) *Attorney, Agent, or Firm* — Hamre, Schumann, Mueller & Larson, P.C.

(57) ABSTRACT

A display panel and a method for manufacturing a display panel that includes a front side and a back side, the display panel including a substrate having a plurality of electrical components provided on a front side of the substrate and integrated circuits connected to the plurality of electrical components, the integrated circuits being embedded in the substrate. A plurality of edge contacts is also provided along edges of the substrate, where the plurality of edge contacts is electrically connected with the integrated circuits. An electrically conductive layer covers at least a part of the front side of the substrate and surrounds the plurality of electrical components, where the electrically conductive layer does not physically contact the embedded integrated circuits and provides electromagnetic interference (EMI) shielding to different components of the display panel.

13 Claims, 5 Drawing Sheets

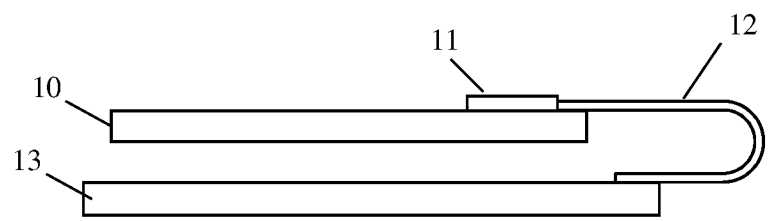
FIG. 1 (Prior Art)
FIG. 2A
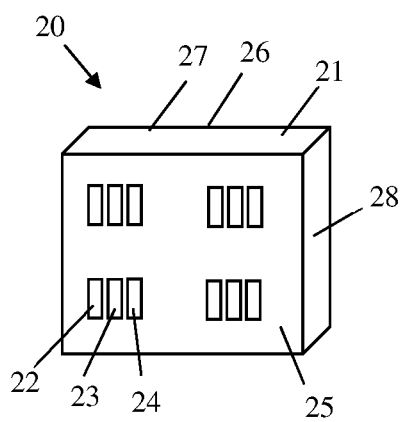
FIG. 2B
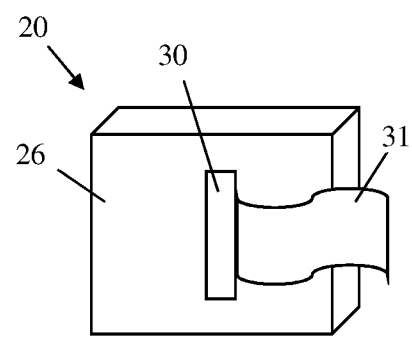
FIG. 2C
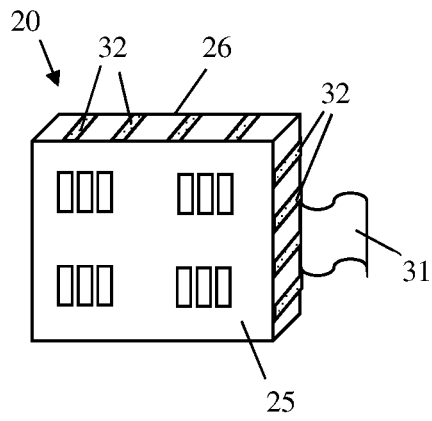
FIG. 2D
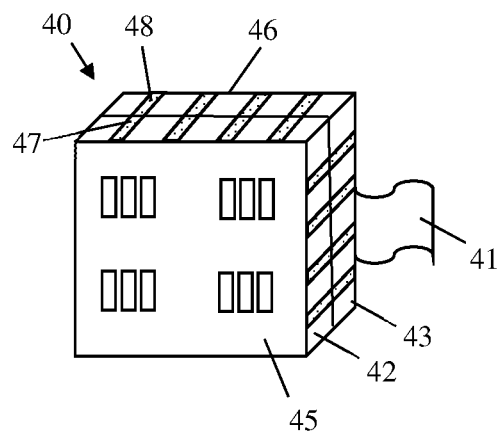

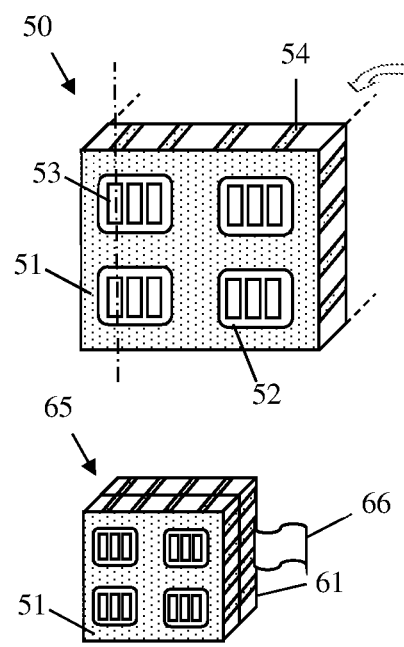
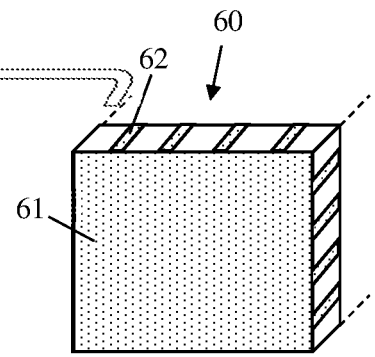
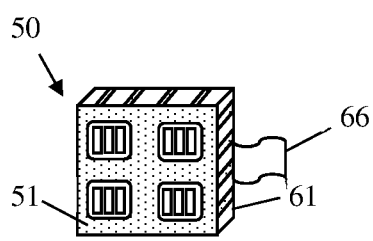
FIG. 3A  FIG. 3B
FIG. 3C  FIG. 3D
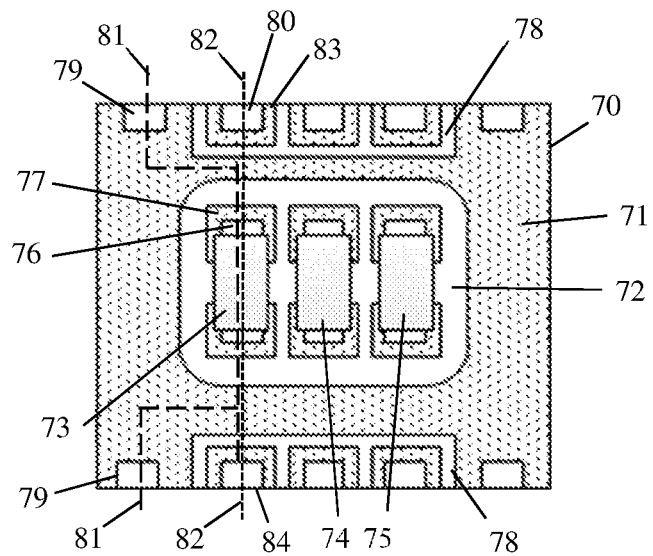
FIG. 4

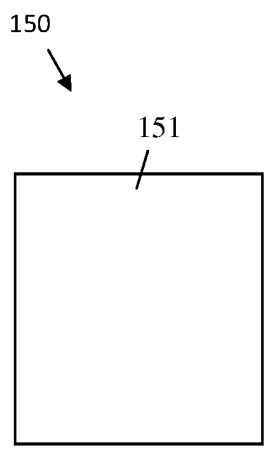
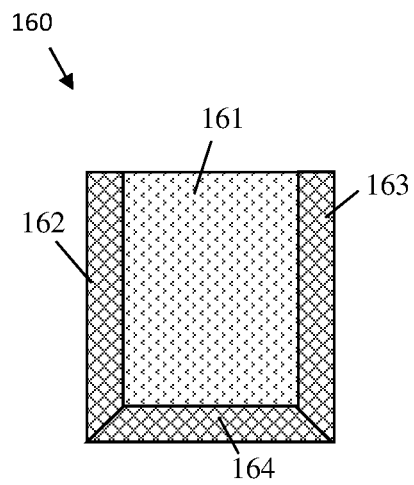
FIG. 9A
FIG. 9B

SYSTEM AND METHOD FOR DISPLAY PANEL

FIELD OF THE INVENTION

The present invention relates to the field of LED/OLED displays and tiled display walls implemented with active matrix technology, for example using TFT (thin film technology).

BACKGROUND OF THE INVENTION

LED displays can be implemented using a TFT-on-glass design, which can reduce monetary cost as well as enable decreased pixel size. The TFT-on-glass design allows the use of a reduced pixel pitch (distance between neighbouring pixels) to be made possible. However, this technology has some challenges. For example, when tiling LED display modules next to each other in a wall configuration, it is desired to decrease the seams between the modules, e.g. the pixel pitch of the neighbouring pixels from two different modules. This leaves less space on the individual modules to place electronics e.g. driving electronics. Flexible cables can be bent around an electronic board to connect the front- and back side. The connection between the front- and back side can also be implemented with via holes. For a further reduction in pixel pitch and when it is difficult to implement via holes, an alternative solution is desired.

It is also common to collect multiple light sources into so-called "banks" so that the multiple light sources can use a common contact. If PWM (Pulse Width Modulation) is used, this may require the use of higher frequency, leading to higher demands on EMC (Electromagnetic Compatibility) management.

Therefore, it is at least an objective of at least one of the embodiments of the present invention to overcome such deficiencies of the prior art to decrease the seams between modules and/or provide EMI shielding due to the demands on EMC management.

SUMMARY OF THE INVENTION

The present invention is at least directed to providing a display panel having an alternative matrix circuit substrate design, display apparatus using such display panels, and a method for manufacturing such matrix circuit substrate. An advantage of certain embodiments of the present invention over the prior art is that a narrower rim region is provided by virtue of the novel structural design, so as to form a lighter and thinner structure.

Another embodiment of the present invention is directed to a display panel and a method for manufacturing the display panel that provides electromagnetic interference (EMI) shielding for the display panel and components thereof. For example, the display panel includes a front side and a back side, where the display panel comprises at least one substrate comprising a plurality of electrical components provided on a front side of the at least one substrate; integrated circuits connected to the plurality of electrical components, the integrated circuits being embedded in the substrate; a plurality of edge contacts provided along edges of the at least one substrate, where the plurality of edge contacts are electrically connected with the integrated circuits; and an electrically conductive layer that covers at least a part of the front side of the at least one substrate and surrounds the plurality of electrical components, where the electrically conductive layer does not physically contact the embedded integrated circuits and provides EMI shielding to different components of the display panel. The electrically conductive layers can be present on either or both of the outward facing surfaces/sides of the display panel to create a closed electrical circuit, which has similar effects as a Faraday cage. The at least one substrate can be an insulating substrate, e.g., glass, having embedded TFT (Thin Film Technology) electronic circuits. Such structure of the substrate enables a method of manufacturing different types of TFT electronic circuits which are processed in groups on the same base substrate, for example, a group for power-, driving- or control circuits, respectively, where the base substrate having the different groups of the TFT electronic circuit can then be cut off and attached in different configurations for the display panel, e.g., separated and attached to the backside of a main substrate.

BRIEF DESCRIPTION OF THE DRAWINGS

These and other technical effects and advantages of embodiments of the present invention will now be described in more detail with reference to the accompanying figures, in which:

FIG. 1 shows a prior art substrate with electronic circuits connected to a flexible cable;

FIG. 2A, FIG. 2B, FIG. 2C, FIG. 2D show embodiments of the present invention comprising a flexible conductor on the backside of the display panel;

FIG. 3A, FIG. 3B, FIG. 3C, FIG. 3D show embodiments of the present invention comprising electrically conductive layers on both sides of the display panel;

FIG. 4 shows an embodiment of the present invention having the electrically conductive layer;

FIG. 9A and FIG. 9B show an embodiment of the present invention for manufacturing multiple TFT processed electronic circuits on one or two substrates.

DETAILED DESCRIPTION OF THE INVENTION

Figure 5:
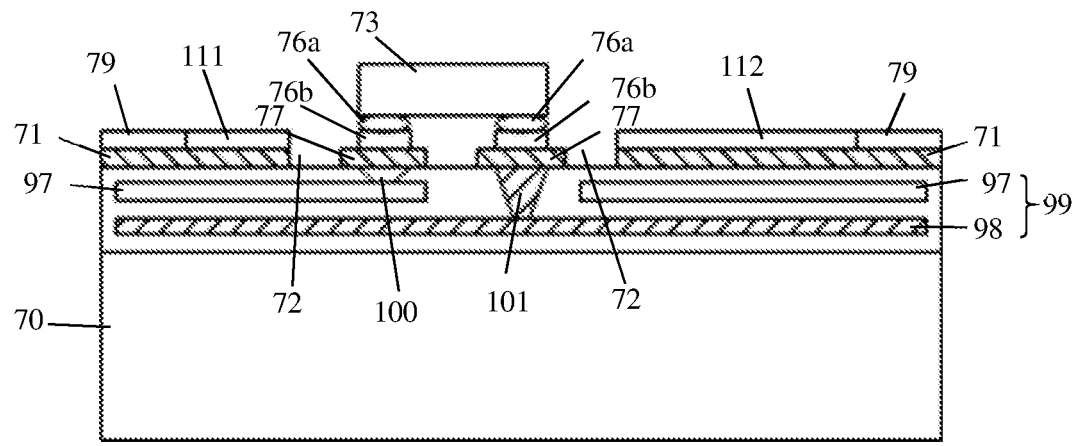
FIG. 5 and FIG. 6 show different cross-sections of the embodiment of the present invention as illustrated in FIG. 4.

The present invention will be described with respect to particular embodiments and with reference to certain drawings but the invention is not limited thereto but only by the various descriptions of the invention. The drawings described are only schematic and are non-limiting, where various descriptions of the features are combinable with any of the described embodiments.

Furthermore, the terms first, second, third and the like in the description and in the claims, are used for distinguishing between similar elements and not necessarily for describing a sequential or chronological order. The terms are interchangeable under appropriate circumstances and the embodiments of the invention can operate in other sequences than described or illustrated herein. Similarly, the terms "front," "back," "top," "bottom", "middle" are used for distinguishing between similar elements and are not necessarily for describing specific positions thereof.

The term "comprising", used in the claims, should not be interpreted as being restricted to the features listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B. Similarly, it is to be noticed that the terms "coupled," "attached", "connected" etc. also used in the description or claims, should not be interpreted as being restricted to direct connections only. Thus, the scope of the expression "a device A coupled to a device B" should not be limited to devices or systems wherein an output of device A is directly connected to an input of device B. It means that there exists a path between an output of A and an input of B which may be a path including other devices or means.

Definitions

Abbreviations
COB=Chip On Board
DDIC=Display Driver Integrated Circuit
EMC=Electromagnetic Compatibility
EMI=Electromagnetic Interference
ENIG=Electroless Nickel Immersion Gold
LED=Light Emitting Diode
OLED=Organic Light Emitting Diode
PCB=Printed Circuit Board
TFT=Thin Film Technology An "active matrix" is a type of electronic circuit used in display technology to drive the display pixels. The circuit is configured so that the state of each pixel can be individually accessed and controlled. For example, LED light sources can be implemented as COB using an insulating substrate (e.g. glass) that has embedded electronics implemented with TFT technology. The electronics is then often configured as an active matrix.

A tiled "display wall" can comprise a multiple of smaller display units or "display panels or modules" that are tiled next to each other so that they together can create a large display. The "display panel" can include a substrate to carry the display light sources and the necessary electronic circuits (e.g. electronic control- or driving circuits) and other electrical components. The display module can include a display panel and additional features, e.g. supporting mechanical structures, but a display panel may also be used as a display module.

An "edge contact" is an electrical contact that is located along the short side or edge of a substrate. The short side or edge extends in a direction that is not parallel with the front- or backside. If the substrate has electronic circuits on its front- and backside, edge contacts can be used to connect the front- and backside electronic circuits.

A "peripheral contact" is an electrical contact that is located at the rim of the front- or backside of a substrate and extends parallel with the substrate front- or backside.

Flexible Conductor

There are various ways to connect a display panel to driving- and control electronics located on a PCB, which is not limiting to the present invention herein. For example, if the substrate is rigid, such as e.g., glass, a flexible conductor can connect the display panel and the PCB. FIG. 1 shows an example of such a prior art design of a display panel where a rigid substrate 10 includes a Display Driver Integrated Circuit (DDIC) 11 that is connected to a printed circuit board (PCB) 13 via a flexible conductor 12. Alternatively, a flexible substrate, e.g., a polyimide substrate (not shown), could be used that can be connected directly with the PCB 13. The DDIC can then alternatively be connected on the flexible conductor or on the flexible substrate.

A display wall can comprise a multiple of display modules or display panels that are tiled next to each other. Flexible conductors are then used to connect the display panels to the driving electronics and to each other. The bending ratio of the flexible conductor is limited and therefore limits the minimum distance provided between the display panels, and hence affects the pixel pitch. The present invention can avoid the problem of the limited minimum distance and pixel pitch by putting the flexible conductor and DDIC on the backside of each display panel. The display driver can be implemented using TFT technology and/or chip-on-board technology (for example, chip-on-glass, chip-on-plastic or chip-on-film where the integrated circuits are wired and bonded to the board).

Flexible Conductor on the Backside

FIGS. 2A-2D show an embodiment of the present invention. FIG. 2A shows a display panel 20 comprising a substrate 21 having multiple electrical components, e.g., light sources 22, 23 and 24, e.g., LED, OLED, and variations thereof, QD-LED, EL-QLED, AMOLED, etc. The display panel 20 has a front side 25, a backside 26 (the side opposing the light sources), and short edges 27 and 28 (only two of which are illustrated). FIG. 2B illustrates that the backside 26 of the display panel 20 has a DDIC 30 and a flexible conductor 31 connected thereto, e.g., pin connection, soldered, etc. The substrate can be made of insulating material, such as, glass, or clear polymer/plastic/polyimide and includes an embedded TFT active matrix. The light sources 22, 23, 24 on the front side 25 of the display panel 20 is connected to the DDIC 30 and the flexible conductor 31 by, e.g., via conductors/connections (not shown) through the substrate and/or electrical edge contacts connected to the via conductors/connections. For example, FIG. 2C shows electrical edge contacts 32 that are provided on the short edges of the display panel 20, where the edge contacts 32 electrically connect the electrical components to the DDIC 30 and flexible conductor 31, e.g., using peripheral contacts and/or embedded integrated circuits. In a variation of this embodiment, as shown in FIG. 2D, display panel 40 includes two substrates 42 and 43, each having multiple edge contacts such as 47 and 48, respectively. The two substrates 42, 43 are connected to each other, where the edge contacts 47 and 48 are connected to correspond to each other e.g. by a conducting glue/adhesive or fuse bonding. Alternatively, a glue that is not electrically conducting can be used in combination with additional side contacts (not shown) which electrically connects the two substrates. The glue/adhesive may comprise spacers (e.g. spheres with a diameter of e.g. 0.1 mm) to enable a uniform alignment of the two substrates forming the display panel. An example of such an acrylic glue with spheres is Sadechaf Uvacryl 2151 from SADECHAF UV BVBA (Turnhout, Belgium). Hence, electronics on the front side 45 of display panel 40 is connected to the flexible conductor 41 on the back side 46 of the display panel 40.

EMI Shielding

In order to decrease the area occupied by electrical contacts on the display panel, the light sources can be arranged in groups that have a common contact, such as laser banks. While this can enable a smaller pixel pitch on the display panel, it may require that the panel is driven at a higher frequency (if e.g. pulsed frequency modulation is used). This in turn can increase signal distortion for both sending and receiving signals between the display panel and the PCB. In so doing, the present invention was also developed since there is an increased need for efficient EMI shielding.

FIG. 3A shows another embodiment of the present invention comprising a display panel substrate 50 having at least one substrate that has a front side, where the front side is provided with a plurality of electrical components, e.g., light source 53, and covered with an electrically conductive layer 51, e.g., metal film, conductive polymer, or layer of colloidal metal, that has openings 52 around the light sources 53 (and/or other electrical components). A plurality of edge contacts 54 are provided on the short edge of the substrate. A second display panel substrate 60 can also be covered with an electrically conductive layer 61, and includes multiple edge contacts 62. Then, as seen in FIG. 3C, the second substrate 60 can be coupled to the first substrate 50 so that the second substrate 60 is attached behind the first substrate 50 so that together the first substrate and the second substrate can form a display panel 65 as shown in FIG. 3C, where the electrically conductive layers 51, 61 sandwich the display panel, e.g., are on the front side and the back side of the display panel. The two substrates can be attached to each other with a glue that is not electrically conducting, and additional electrical side contacts (not shown) can be added to electrically connect the substrates. Additionally, a flexible conductor 66 is connected to the backside of the display panel. However, similar to the display panel illustrated in FIG. 2C, the display panel may comprise only a single substrate, where the electrical components are provided on both the front side and back side of the display panel and/or substrate: FIG. 3D shows how the electrically conductive layer 61 is deposited directly to the backside of the substrate 50. A flexible conductor 66 is connected to the backside of the substrate 50, where the electrically conductive layer 51 can be the uppermost layer of a TFT stackup, as discussed below. It is appreciated that the electrically conductive layer 51 can comprise one layer or multiple sub layers.

Disconnection from EMI Layer

Without wishing to be bound by theory, the electrically conductive layer of the display panel acts as a Faraday cage to protect the electrical components of the display panel from EMI. It is preferred that the electrical components/circuits to be protected do not physically contact the electrically conductive layers being used for EMI shielding, as discussed further herein.

Figure 6:
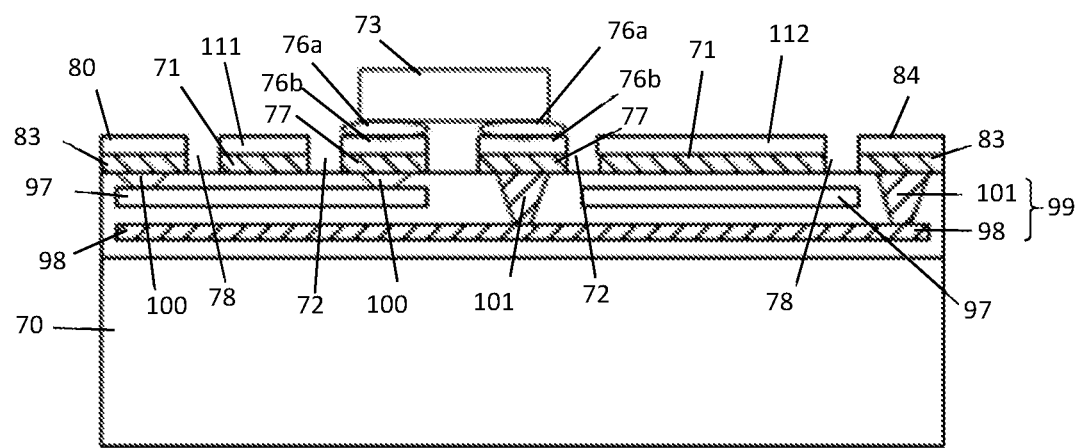

FIG. 4 shows such a disconnection from the EMI layer by illustrating a display panel having a region similar to one of the openings 52 in FIG. 3. Specifically, FIG. 4 illustrates a substrate 70 comprising an electrically conductive layer 71 having an opening 72. A plurality of electrical components, for example, a plurality of light sources comprising light sources 73, 74 and 75, are placed within the opening 72. Within the opening 72, the electrically conductive layer 71 is not present within the opening, e.g., the electrically conductive layer 71 is disconnected from the electrical components. The light source 73 is connected to the substrate 70 via connecting means 76, for example a solder- or adhesive material, and a conductive layer 77. The electrically conductive layer 71 or conductive layer 77 can comprise one or more layers. For illustration purposes only, FIG. 4 shows peripheral contacts, where only peripheral contacts 79, 80 and 84 are identified. Peripheral contacts 80 and 84 are connected to the light sources 73, 74, 75 via circuits in an underlying layer, e.g., by an active matrix comprising TFT layers. For example, light source 73 can connect to peripheral contacts 80 and 84 via circuits (or TFT layer connections 97 and 98 as shown in FIG. 6), respectively. Peripheral contact 79 is connected to the electrically conductive layer 71 but not to the light source(s) 73. This is an explanatory illustration to show how the light sources are connected to the active matrix and peripheral contacts, where in a display panel there can be many light source groups that can be placed between the peripheral contacts, which are then connected to edge contacts for driving and/or controlling the electrical components, e.g., acting as data lines, scan lines, control lines, etc. The electrically conductive layer 71 can be in direct contact to any of the peripheral contacts 79, for example by depositing the peripheral contacts 79 directly on top of electrically conductive layer 71.

FIG. 5 shows the cross section of the display panel along the cross-section line 81 in FIG. 4. The light source 73 is mounted onto the substrate 70 via connecting means 76a, 76b, for example, which can include a solder or adhesive material. The conductive layers 77 (e.g. copper, gold, electrically conductive polymer) further connect the light source 73 to the active matrix 99. The connecting means can include protective layers 76b (e.g., ENIG) to protect the conductive layers 77 from corrosion/oxidation and facilitate good surface conditions for soldering. The substrate 70 also includes the active matrix 99 that is embedded in the substrate, where the active matrix 99 comprises at least TFT layers 97, 98 and via connectors 100 and 101 that electrically connect the TFT layers 97, 98 to the light source 73. The electrically conductive layer 71 can be provided as a top-layer of the active matrix 99 and includes the opening 72 which has gaps that prevents the electrically conductive layer 71 to be in physical contact with the electrical components and the embedded integrated circuits, e.g., the light source 73 and the active matrix 99, which enables the electrically conductive layer 71 to provide EMI shielding to the display panel, e.g., the active matrix 99 and/or electrical components. That is, the electrically conductive layer 71 does not physically contact the embedded circuits and no part of the electrically conductive layer 71 surrounds (or immediately surrounds, e.g., is around but does not contact) the electrical components. The electrically conductive layer 71 may also be covered by electrical insulation layers 111 and 112, which can prevent corrosion of the electrically conductive layer 71. As illustrated in FIG. 5, it is understood that the light source 73 is not electrically connected to the peripheral contact 79, as shown in FIG. 4 along cross-section line 81. However, the peripheral contact(s) 79 is electrically connected to the electrically conductive layer 71 and the edge contacts and back side electronic components (as previously described above). Instead, the light source 73 is electrically connected to the peripheral contacts 80 and 84, as shown in FIG. 4 along, cross-section line 82 via the active matrix 99 in FIG. 6. The peripheral contacts 80 and 84 are electrically connected to the edge contacts and back side electronic components (as previously described above).

FIG. 6 shows the cross section of the display panel along the cross-section line 82 in FIG. 4. Similar to the embodiment in FIG. 5, this cross section shows the light source 73 being mounted on the substrate 70 via connecting means 76a, 76b, where the conductive layers 77 connect the light source 73 to the active matrix 99. The active matrix 99 comprises TFT layers 97 and 98 and via connectors 100 and 101, which connect the light source 73 to peripheral contacts 80 and 84 for controlling of the light source 73 (or other electrical components). Similar to FIG. 5, FIG. 6 includes the electrically conductive layer 71 provided as a top layer of the active matrix 99. However, FIG. 6 also illustrates that the electrically conductive layer 71 further comprises gaps 78 between the peripheral contacts 80 and 84 and the electrically conductive layer 71 resulting in the electrically conductive layer 71 not being in physical contact with the peripheral contacts 80 and 84, e.g., the gaps disconnect the electrically conductive layer 71 from the peripheral contacts 80 and 84.

Figure 7:
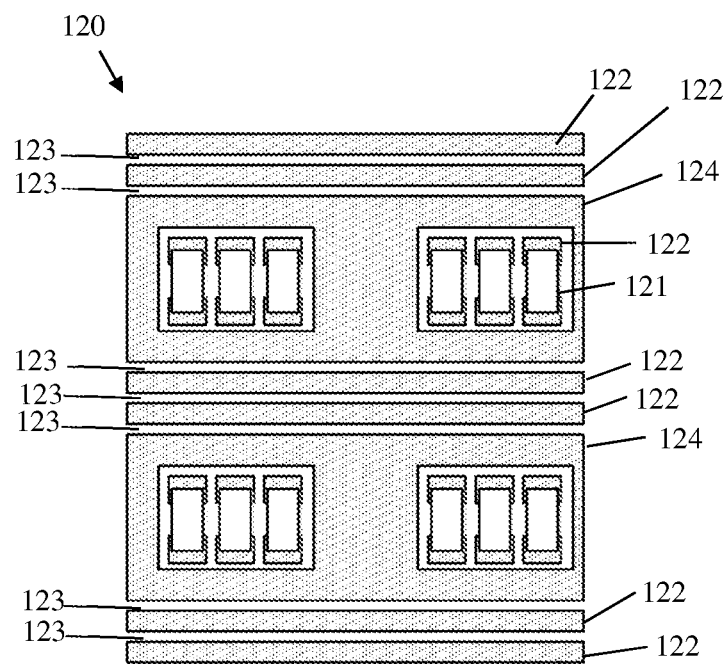
FIG. 7 shows a top view of another embodiment of the present invention.

FIG. 7 shows a top view of another embodiment of the present invention, where a display panel 120 has a plurality of light sources, where only light source 121 is identified for clarity. In this embodiment, conductive layers 122 and 124 are deposited/formed on the substrate where multiple gaps 123 are provided between the conductive layers 122 and 124. Each "strip" of conductive layer 122 is configured to be usable as a power line for the plurality of light sources, where the conductive layer 122 can be connected to a conductive layer (not shown) on the backside of the display panel and/or through the active matrix, e.g. by edge contacts or via connectors/connections as described above. For example, the strips of conductive layers 122 can be used to conduct current to the light source 121. In view of such multiple gaps 123, it is understood that the conductive layers 124 are electrically insulated from the conductive layers 122 and can further be kept at a different voltage. Accordingly, the conductive layers 124 can provide EMI shielding.

It is appreciated that the conductive layers may be patterned in other suitable configurations, such as for example a grid, hash or net pattern and still effect EMI shielding due to the gaps between the conductive layers between different components of the display panel.

Manufacturing Method

The present invention is also directed to a method for manufacturing a matrix circuit substrate and display panel as discussed above. In such an exemplary method, the method comprises the steps of forming at least one main substrate layer, where the at least one main substrate layer comprises insulating material, such as glass, or plastic (e.g. Polyimide (PI), polyethylene terephthalate (PET), Polymethylmethacrylate (PMMA), etc.), where the substrate layer can be a rigid or flexible substrate. Next, at least one buffer layer is provided/formed over the at least one main substrate layer to form the substrate, where integrated circuits, such as TFT circuits, are embedded in the substrate. The at least one buffer layer can be the same material as the substrate layer or a different material that is used to protect the TFT circuits, improve thermal conductivity, prevent diffusing of particles, or other reason. The TFT circuits can be formed from metal oxide semiconductor materials, metals and oxides thereof, organometallic powders, electrically conductive polymers, and/or polycrystalline semiconductor materials, but is not limited thereto. An electrically conductive layer is then provided over or on top of the TFT circuits, e.g., as a top layer or above the TFT circuits, where openings are provided in the electrically conductive layer. The opening can be provided by etching, deposition methods, masking, etc. An electrically insulation layer and/or peripheral contacts are then provided above the electrically conductive layer and the edge contacts are provided along the edges of the substrate, where the peripheral contacts and/or edge contacts are provided by plating, deposition, etching, etc. A plurality of electrical components is provided in the openings in the electrically conductive layer and attached to the substrate and electrically connected to the integrated circuits. For example, the plurality of electrical components can be attached to the substrate via soldering or using adhesives and by providing a conductive layer and/or protective layer to protect the conductive layer from corrosion/oxidation and facilitate good surface conditions for soldering, where via connections are provided in the substrate for electrical connection to the integrated circuits, e.g., by having via holes through the substrate. As discussed above, such manufacturing allows the electrically conductive layer to not physically contact the embedded integrated circuits and/or the electrical components. It is understood that the various layers and openings can be provided using deposition methods, such as laser annealing, plasma enhanced chemical vapor deposition (PECVD), chemical vapor deposition (CVD), atomic layer deposition (ALD), electrodeposition, expanding thermal plasma, crystallization step, or similar methods, photoresist methods, masking processes, chemical etching processes, laser etching processes, stripping methods, or the like.

In another embodiment of the present invention the manufacturing method further comprises forming the driving- and power electronic circuits by implementing the TFT circuits on the same substrate as the display panel. This is advantageous since multiplexers and current mirrors can be added inside the driving electronic circuit so that the number of contacts to the driving electronics on the PCB can be greatly reduced. Further, the driver and power electronic circuits can contain functional designs by TFT to reduce the driving overhead needed to light up the display panel. In so doing, the DDIC described above may no longer be necessary, in some embodiments of the invention.

Figure 8A:
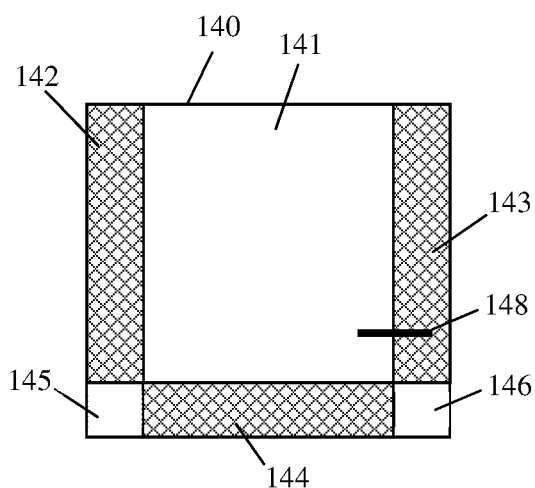
FIG. 8A and FIG. 8B show an embodiment of the present invention for manufacturing multiple TFT processed electronic circuits on one substrate.

For example, FIG. 8A illustrates a snapshot during the substrate manufacturing process of the display panel. The substrate 140 having the embedded integrated circuits, e.g., TFT electronic circuits, can be divided into a multiple of segments 141, 142 and 143, where each segment comprises TFT electronic circuits for use with different purposes. This design is advantageous since it can enable the processing of electronic circuits for a multiple of purposes at the same time on the same substrate. For example, the display segment 141 can have TFT electronic circuits for driving the light sources. Flanking segments 142 and 143 can be used for distributing power to the display as well as having line select capabilities (e.g. accessing each line separately by scanning of the display). Segment 144 can be used to handle level shifting, e.g. translate driving levels into TFT voltage levels. It can also comprise current mirroring, e.g. multiplying one current source into many current sources. The corner segments 145 and 146 can be disposed or used for e.g. test circuits. In practice, available space on existing etching masks can be used for any of the segments. The present invention is not limited to this specific placement of the functionalities on the flanking segments, but such placement and functionalities are provided as examples thereof.

Figure 8B:
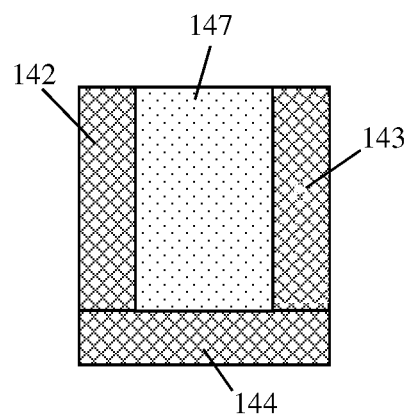

The substrate segments 143, 144 and 145 can then be separated from the display segments 142 and placed back-to-back on the display panel, e.g. by using electrically conductive adhesives or fuse bonding. FIG. 8B shows the backside 147 of the substrate with the cut off segments 142, 143 and 144 attached to the substrate. It is appreciated that the size of the cut-off segments and the corresponding electronic circuits can be adapted to fit on the backside 147.

A further advantage of the present invention is that it can provide perfect alignment between the electrical conductors on the display panel and electrical conductors on the control or driver pane since they can be continuously drawn as one over the different segments before they are cut, see exemplary line 148. Another advantage with such display panel is that it can be made without having to allocate area for power- and driving circuits on the display front side. If such display panel is used in a tiled display wall, the display panel is provided so that the distance between pixels on two neighbouring display panels can be significantly decreased.

FIGS. 9A and 9B shows another embodiment of the present invention where the frontside and backside of the display panel are processed on two separate substrates. FIG. 9A shows the first substrate 150 comprising the processed electronic circuits 151 for the display segment. FIG. 9B shows the second substrate 160 comprising the power- and driving electronic circuits 162, 163 and 164, and the display segment backside 161. The substrates 150 and 160 can then be attached back-to-back and fixed to each other e.g. using electrically conductive adhesive glue or fuse bonding.

Alternatively, it is understood that if dual side TFT processing is available, the power- and driving circuits 162, 163 and 164 can be processed directly onto the backside of the first substrate 150. This results in a compact design having a thickness of only one substrate or display panel. An additional advantage is that a monolithic stack reduces assembly time.

The embodiments of FIGS. 8A-8B and 9A-9B comprise means for electronic connection between the front- and back sides, for example using via connectors or peripheral contacts or edge contacts as described above. The embodiments can also comprise the electrically conductive layer on the backsides 147 or 161 to enable EMI shielding, as discussed above.

The above content is illustrative rather than restrictive. Any equivalent modification or change made to the present invention without departing from the scope thereof should be included in the various embodiments of the invention. Accordingly, it is intended that the invention covers modifications and variations of the invention which includes various combinations of different aspects of the invention.

The invention claimed is:

1. A display panel having a front side and a back side, said display panel comprising:
   at least one substrate comprising a plurality of electrical components provided on a front side of the at least one substrate;
   integrated circuits connected to the plurality of electrical components, said integrated circuits being embedded in the at least one substrate;
   a plurality of edge contacts provided along edges of the at least one substrate, said plurality of edge contacts being electrically connected with the integrated circuits, wherein said edges are provided between the front side and a back side of the at least one substrate, and
   an electrically conductive layer covering at least a part of the front side of the at least one substrate and surrounding the plurality of electrical components,
   wherein the at least one substrate is configured so that the electrically conductive layer does not physically contact the embedded integrated circuits.

2. The display panel according to claim 1, wherein the plurality of electrical components comprises a plurality of light sources.

3. The display panel according to claim 1, wherein the electrically conductive layer is provided with openings for the plurality of electrical components, wherein the plurality of electrical components is placed within the openings so that there is no physical contact between the electrically conductive layer surrounding the plurality of electrical components and the electrical components.

4. The display panel according to claim 3, wherein the plurality of electrical components is electrically connected to the at least one substrate via connecting means.

5. The display panel according to claim 4, wherein the integrated circuits are provided as an active matrix, said active matrix comprising thin-film-transistor (TFT) layers, wherein said electrically conductive layer is provided above the TFT layers.

6. The display panel according to claim 5, wherein an electrical insulation layer is provided above the electrically conductive layer.

7. The display panel according to claim 1, wherein the electrically conductive layer comprises a first part and a second part that are separated by gaps, said first part configured as a power line for the plurality of electrical components, wherein said first part and said second part are electrically insulated from each other.

8. The display panel according to claim 7, wherein the first part of the electrically conductive layer is kept at a voltage different than that of the second part of the electrically conductive layer.

9. The display panel according to claim 1, further comprising at least one second substrate, wherein said a least one second substrate comprises a second electrically conductive layer and a second plurality of edge contacts, wherein the at least one second substrate is attached to the at least one substrate to form the display panel.

10. The display panel according to claim 9, wherein the second electrically conductive layer covers said back side of the display panel.

11. The display panel according to claim 1, wherein the at least one substrate comprises insulating material.

12. The display panel according to claim 11, wherein the insulating material is glass.

13. A display panel having a front side and a back side, said display panel comprising:
   at least one substrate comprising glass, said at least one substrate comprising a plurality of electrical components provided on a front side and a back side of the at least one substrate;
   integrated circuits connected to the plurality of electrical components, said integrated circuits being embedded in the at least one substrate;
   a plurality of edge contacts provided along edges of the at least one substrate, said plurality of edge contacts being electrically connected with the integrated circuits, wherein said edges are provided between the front side and the back side of the at least one substrate, and
   an electrically conductive layer covering at least a part of the front side and at least a part of the back side of the at least one substrate and surrounding the plurality of electrical components,
   wherein the at least one substrate is configured so that the electrically conductive layer does not physically contact the embedded integrated circuits.

* * * * *